(12) United States Patent
Cobb et al.

(10) Patent No.: US 7,620,080 B2
(45) Date of Patent: Nov. 17, 2009

(54) LASER PULSE CONDITIONING

(75) Inventors: Joshua Monroe Cobb, Victor, NY (US); Paul G Dewa, Newark, NY (US)

(73) Assignee: Corning Incorporated, Corning, NY (US)

( * ) Notice: Subject to any disclaimer, the term of this patent is extended or adjusted under 35 U.S.C. 154(b) by 8 days.

(21) Appl. No.: 11/895,225

(22) Filed: Aug. 23, 2007

(65) Prior Publication Data

US 2009/0052480 A1    Feb. 26, 2009

(51) Int. Cl.
*H01S 3/10* (2006.01)
(52) U.S. Cl. .............................. 372/25; 372/26; 372/13; 372/9; 372/57; 372/55
(58) Field of Classification Search ................ 372/25, 372/26, 13, 9, 57, 55
See application file for complete search history.

(56) References Cited

U.S. PATENT DOCUMENTS

| | | | |
|---|---|---|---|
| 5,003,543 A * | 3/1991 | Morsell et al. ................. | 372/5 |
| 5,309,456 A | 5/1994 | Horton ........................ | 372/25 |
| 6,535,531 B1 | 3/2003 | Smith et al. .................... | 372/25 |
| 6,704,339 B2 | 3/2004 | Lublin et al. .................. | 372/57 |
| 6,928,093 B2 | 8/2005 | Webb et al. .................... | 372/25 |
| 7,016,388 B2 | 3/2006 | Klene et al. .................... | 372/55 |
| 7,084,959 B2 | 8/2006 | Albert .......................... | 355/67 |
| 7,187,500 B2 | 3/2007 | Chuang et al. ............. | 359/618 |
| 2005/0105579 A1 | 5/2005 | Smith et al. .................... | 372/55 |
| 2006/0001878 A1* | 1/2006 | Das et al. ..................... | 356/400 |
| 2007/0237192 A1* | 10/2007 | Das et al. ...................... | 372/25 |
| 2008/0225904 A1* | 9/2008 | Brown et al. .................. | 372/22 |

OTHER PUBLICATIONS

Japanese Abstract of JP2005303135.

* cited by examiner

*Primary Examiner*—Minsun Harvey
*Assistant Examiner*—Kinam Park
(74) *Attorney, Agent, or Firm*—Timothy M Schaeberle

(57) ABSTRACT

A light pulse conditioning apparatus has at least first and second curved reflective surfaces that share a common focus and a light-redirecting element disposed between the first and second curved reflective surfaces to redirect at least a portion of an incident light beam toward the second curved reflective surface as a delayed beam portion. A beam-shifting compensating element is disposed between the first curved reflective surface and the light-redirecting element and in the path of the delayed beam portion, for shifting the optical path of the delayed beam portion as it returns toward the light-redirecting element.

11 Claims, 22 Drawing Sheets

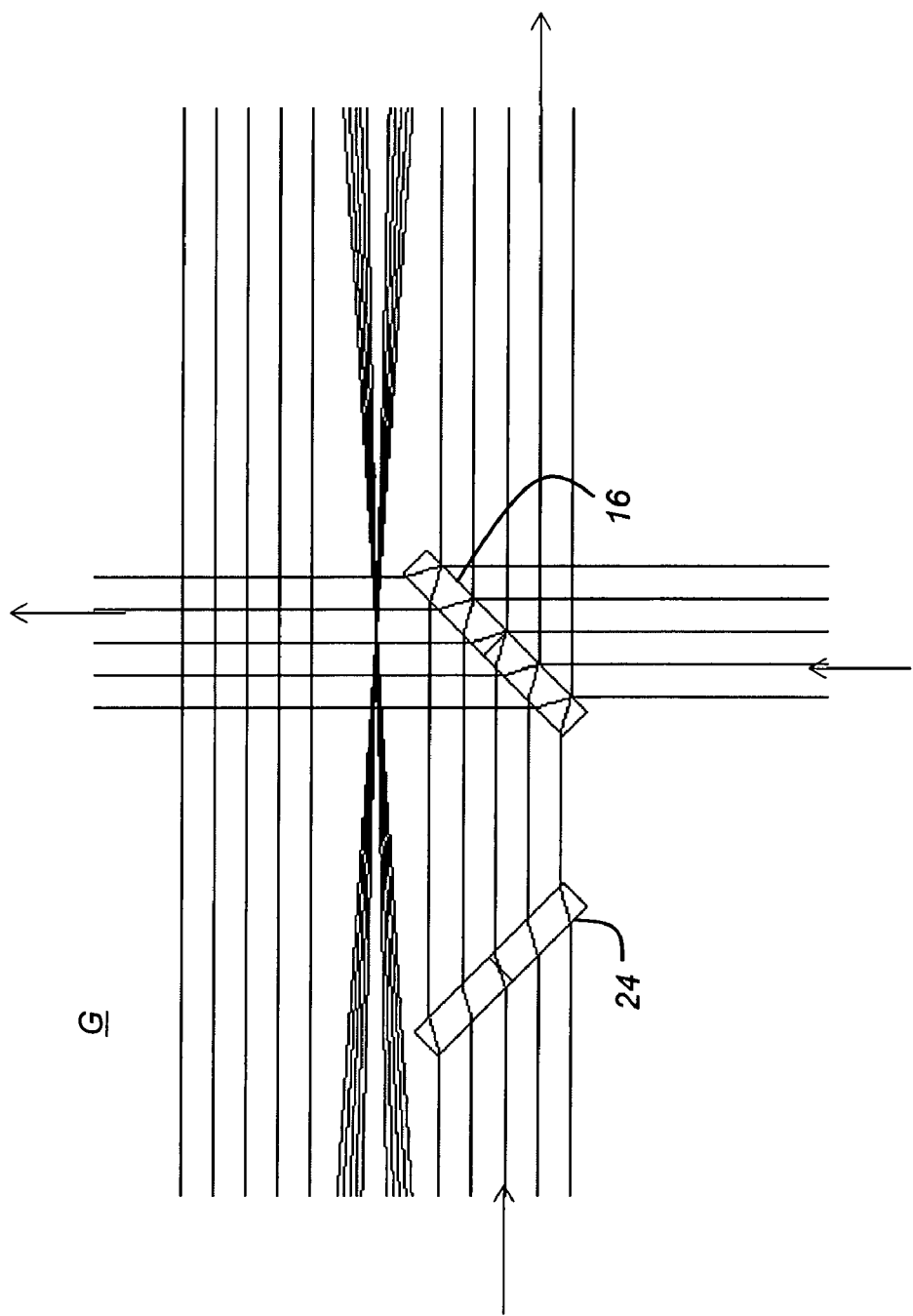

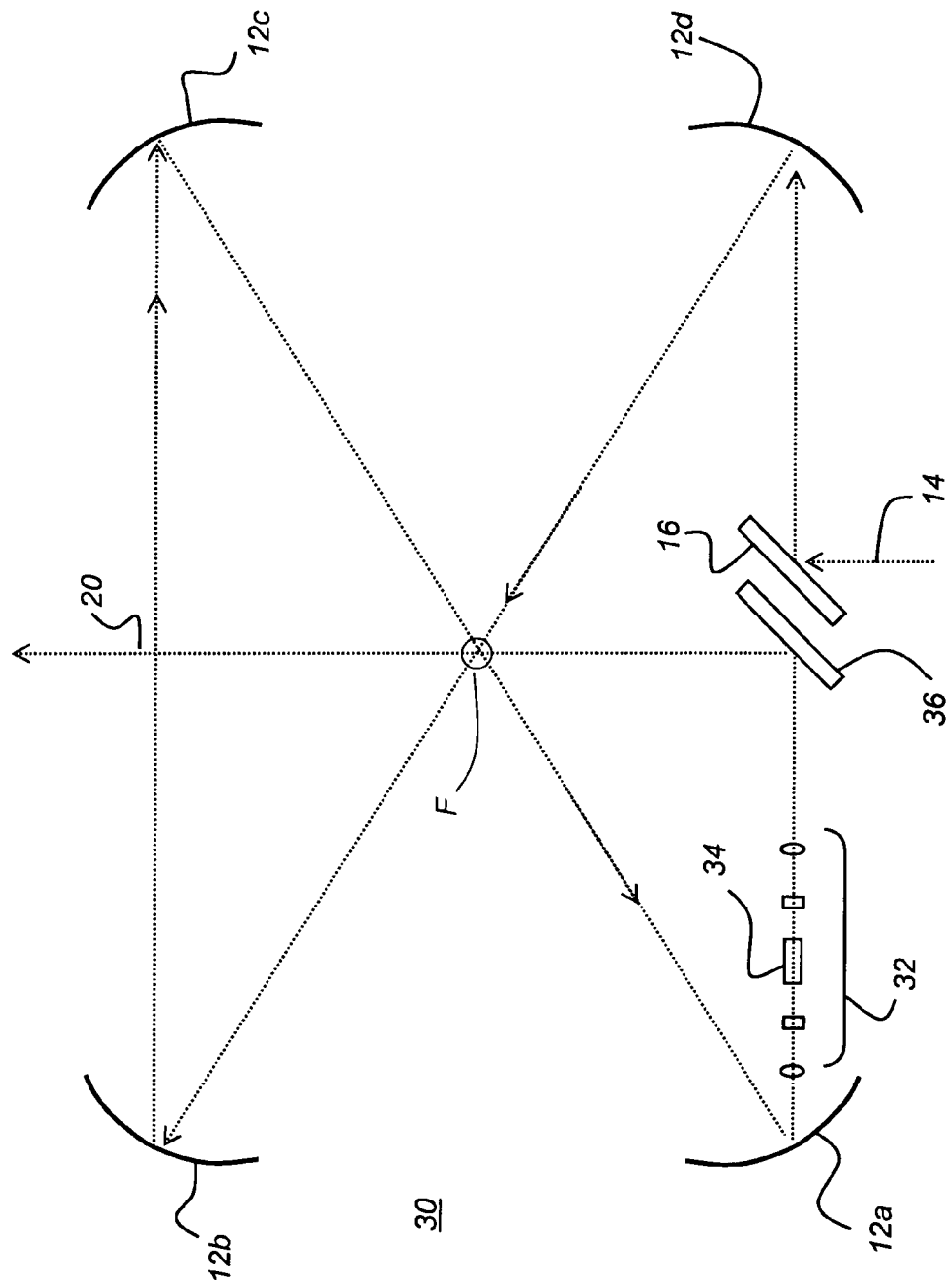

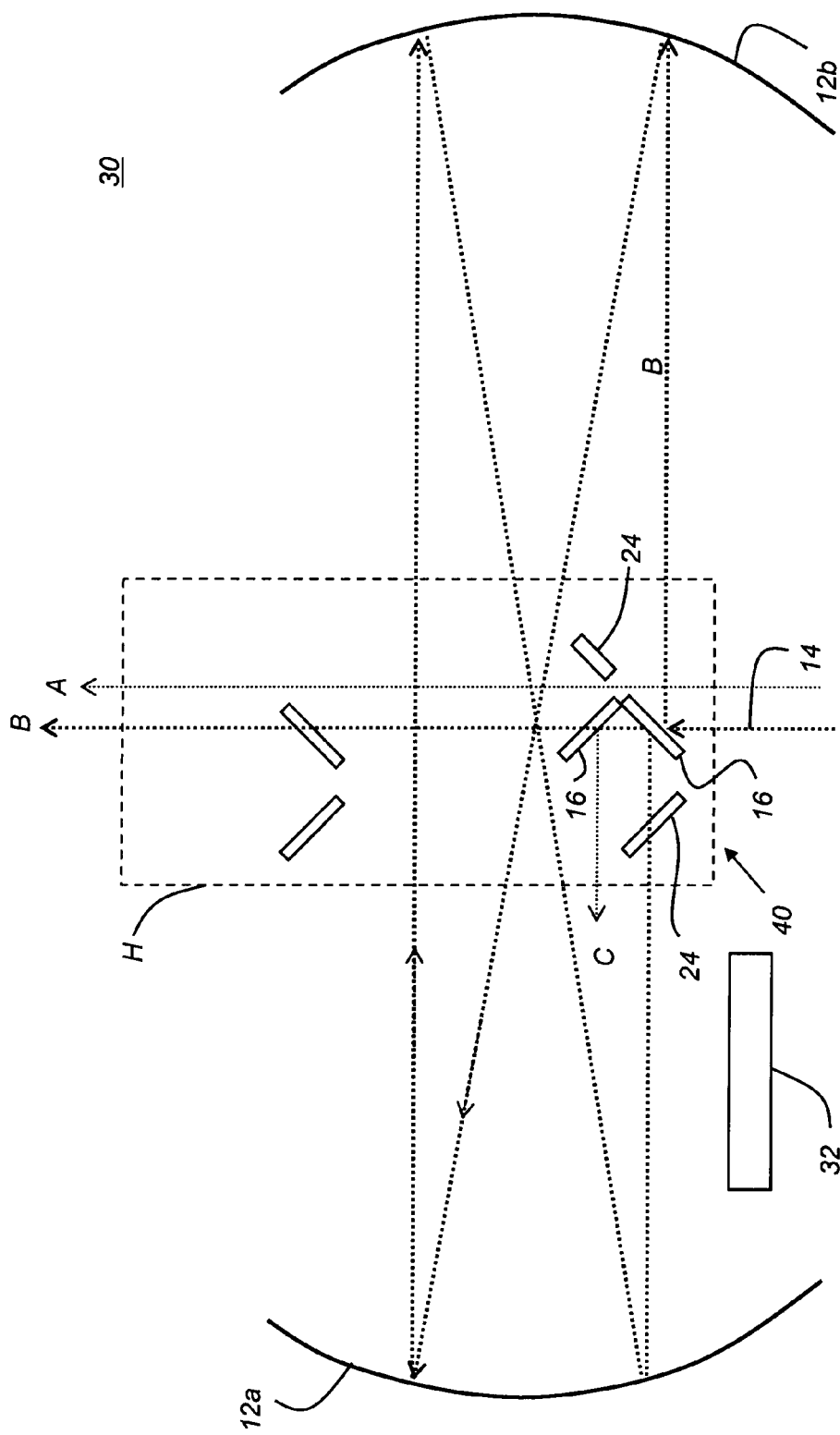

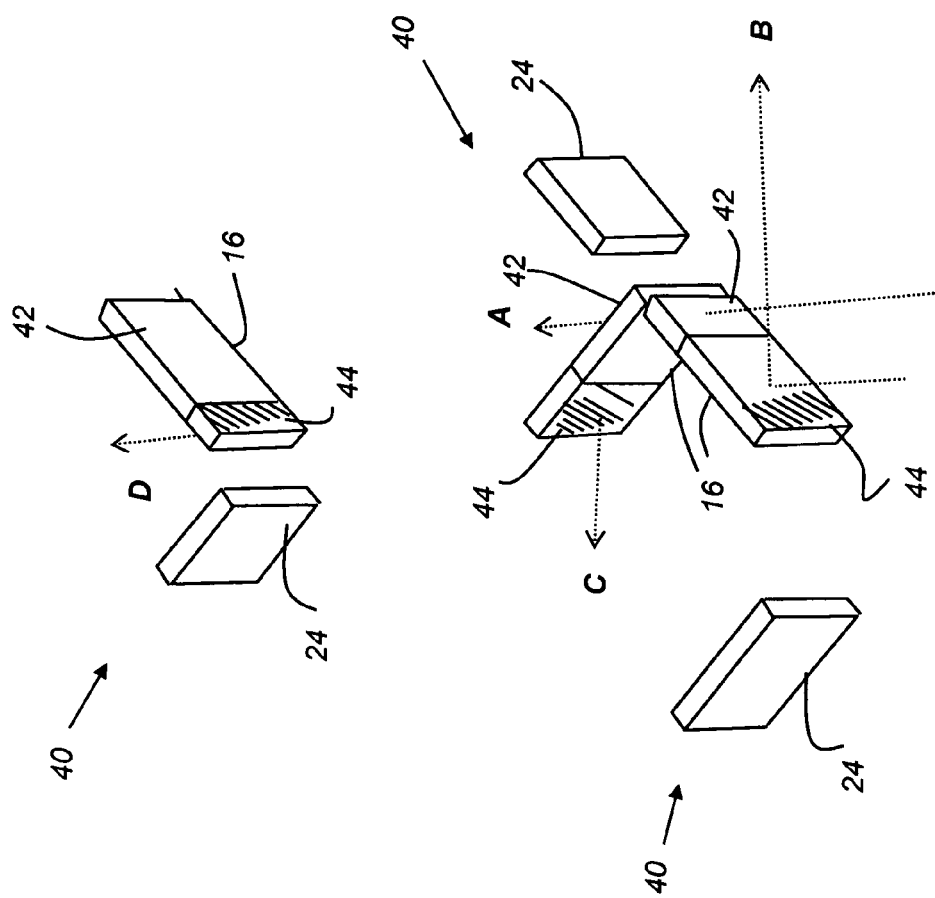

LASER PULSE CONDITIONING

FIELD OF THE INVENTION

This invention generally relates to controlling pulse-to-pulse power for high-frequency pulsed light sources and more particularly relates to a method and apparatus for conditioning pulsed laser output.

BACKGROUND OF THE INVENTION

Pulsed lasers are widely used for precision energy delivery in equipment ranging from surgical devices to lithography systems for forming electronic microcircuits. Among various types of pulsed lasers, the excimer laser, a type of electric discharge gas laser, has been widely used for microcircuit lithography. In lithography, the surface of a wafer is exposed to a pattern of high energy, typically in the high-energy ultraviolet (UV) range, that forms the various microcircuit components. A photoresist or other material deposited on the substrate surface responds to the high-energy pattern, projected onto the surface using a precision optical system, forming the various circuit features in a combination of exposure and etching stages.

One well-known difficulty that is inherent to the microlithography process relates to the high peak-power density that is required and its impact on optical components. The optical subsystems that condition and deliver high-energy pulsed UV or other radiation, typically from excimer or other lasers, can be damaged over time and the lens assemblies used can be extremely costly to replace. Even the down time for repair or replacement of the supporting optical components is highly undesirable, slowing productivity in the wafer-to-microcircuit fabrication process.

One practice for reducing the effects of high peak-power density for pulsed laser sources is to smooth or modify the laser pulse before directing it through the optical system. Pulse stretchers for changing the distribution of pulse energy are described, for example, in U.S. Pat. No. 6,928,093 entitled "Long Delay and High TIS Pulse Stretcher" to Webb et al. and U.S. Pat. No. 6,535,531 entitled "Gas Discharge Laser with Pulse Multiplier" to Smith et al. As an illustrative example of pulse stretching, a plot showing a single laser pulse over time is shown as a pulse 18 in FIG. 1A. FIG. 1B shows how a pulse stretcher can modify the distribution of pulse energy over time for forming a conditioned pulse 28. The value $T_{is}$ or "time-integrated square" is a metric used to express the effective pulse duration of the stretched pulse, as described, for example, in the '093 Webb et al. disclosure. One aspect of pulse stretching is delay of some or all of the initial laser pulse, as shown for pulse 28 in the example of FIG. 1C.

Pulse stretching generally uses a beamsplitter that redirects a percentage of incident light, causing the "ringing" effect of the pulse pattern as its amplitude decays over time, as shown in the example of FIG. 1B. Using mirrors or other highly reflective surfaces, delay can also be used to provide pulse stretching with a discrete number of pulse components, as is shown in a simple case with two components in modified pulse 28 of FIG. 1E.

Pulse stretching and delay techniques not only reduce the peak power of the laser, but also help to minimize coherence of the laser light. Without pulse stretching or other measures, highly coherent lasers can create undesirable interference artifacts in the laser illumination, commonly known as speckle.

Although pulse delay and stretching techniques have been practiced, however, conventional solutions for changing the pulse profile in these ways require complex arrangements of components and necessitate considerable alignment efforts in order to provide the laser beam along a single beam path without increased beam width. For example, four or more facing curved mirrors must be adjusted to align the optical paths in solutions shown in both the '093 Webb et al. and '531 Smith et al. disclosures.

Another problem that is not addressed by conventional pulse delay or stretching solutions relates to the need for improving pulse-to-pulse energy uniformity. One undesirable characteristic of the excimer laser is that the power level, pulse-to-pulse, can vary over a range. Conventional pulse stretching or delay solutions can smooth out the pulse energy distribution, but do not offer ways for attenuating pulse energy at the same time. Pulse attenuation must be performed elsewhere in the optical system, either preceding or following the pulse stretching or delay apparatus. It would be advantageous not only to modify the energy distribution of the laser beam over time, but also to be able to modulate one or more portions of this energy distribution at the same time.

SUMMARY OF THE INVENTION

It is an object of the present invention to advance the art of pulsed laser modulation. With this object in mind, the present invention provides a light pulse conditioning apparatus comprising:
  a) at least first and second curved reflective surfaces that share a common focus;
  b) a light-redirecting element disposed between the first and second curved reflective surfaces to redirect at least a portion of an incident light beam toward the second curved reflective surface as a delayed beam portion;
  c) a beam-shifting compensating element disposed between the first curved reflective surface and the light-redirecting element and in the path of the delayed beam portion, for shifting the optical path of the delayed beam portion as it returns toward the light-redirecting element.

It is a feature of the present invention that it employs at least two opposing curved reflective surfaces and provides compensation for refractive effects of the light-separating and light-recombining components.

It is an advantage of the present invention that it allows conditioning of both the time profile and energy distribution of a laser pulse.

These and other objects, features, and advantages of the present invention will become apparent to those skilled in the art upon reading the following detailed description when taken in conjunction with the drawings wherein there are shown and described illustrative embodiments of the invention.

BRIEF DESCRIPTION OF THE DRAWINGS

FIG. 4 is an enlarged view of the compensating plate and beam-redirecting element in one embodiment.

FIG. 5B is a schematic diagram showing a light pulse conditioning apparatus with an attenuator apparatus in an embodiment using more than two confocal mirrors.

FIGS. 8A, 8B, 8C, and 8D are schematic diagrams that show each delay path for the pulse conditioning apparatus of the embodiment shown in FIG. 7.

FIG. 9 is a perspective view showing reflective, transmissive, and compensating plate elements that are in each delay path for the pulse conditioning apparatus of the embodiment shown in FIG. 7.

DETAILED DESCRIPTION OF THE INVENTION

Figure 1A:
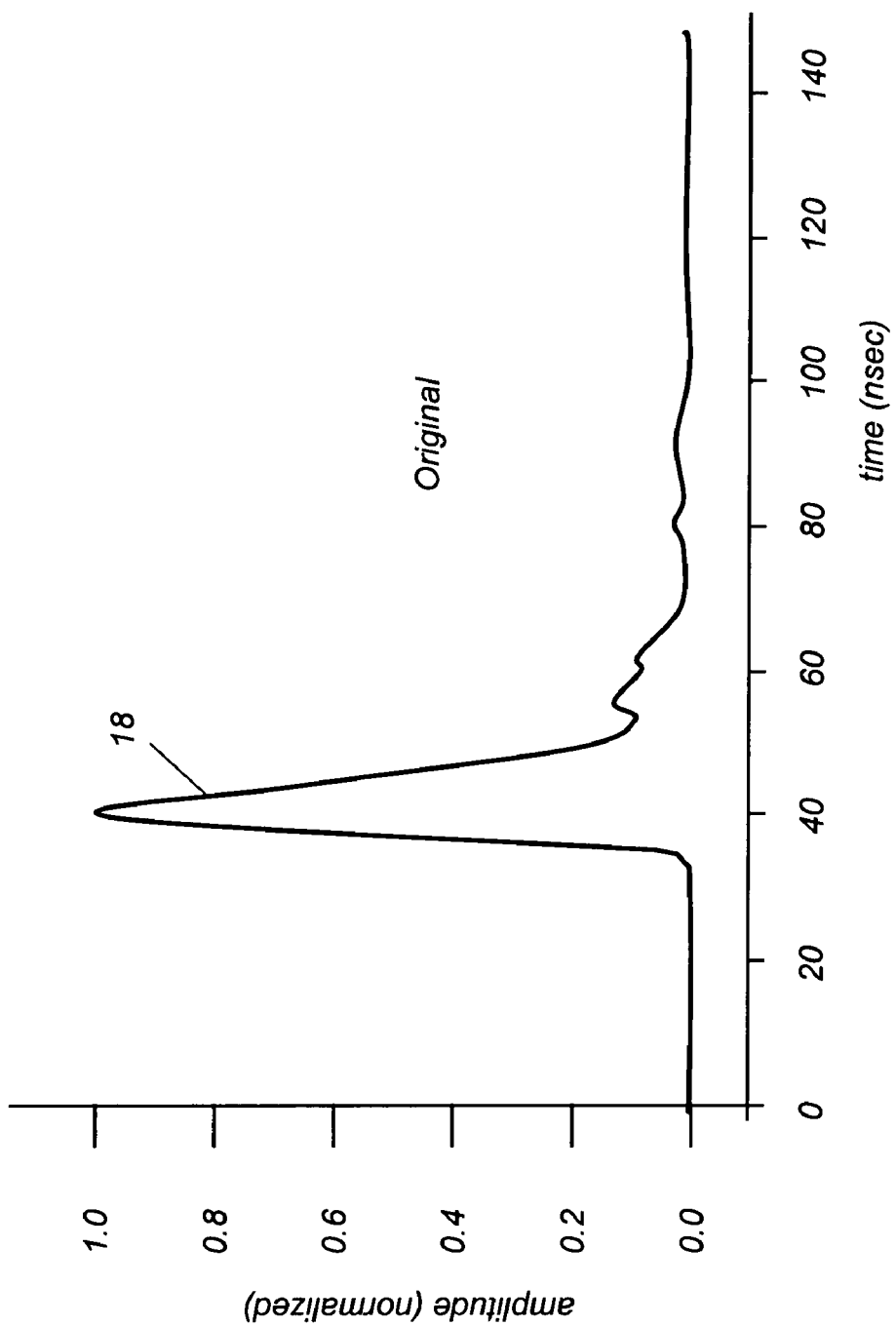
FIG. 1A is a graph showing pulse energy over time for an original laser pulse.

Embodiments of the present invention improve upon conventional methods for light pulse conditioning and address the need to maintain a narrow beam width, to reduce overall parts count and alignment complexity, and to attenuate power for at least some portion of the original light pulse that it receives.

Figures shown and described herein are provided in order to illustrate key principles of operation and component relationships along their respective optical paths according to the present invention and are not drawn with intent to show actual size or scale. Some exaggeration may be necessary in order to emphasize basic structural relationships or principles of operation. Some conventional components that would be needed for implementation of the described embodiments, such as optical mounts or necessary support structures, for example, are not shown in the drawings in order to concentrate description on the invention itself. In the drawings and text that follow, like components are designated with like reference numerals, and similar descriptions *concerning components and arrangement or interaction of components already described are omitted.

Figure 1B:
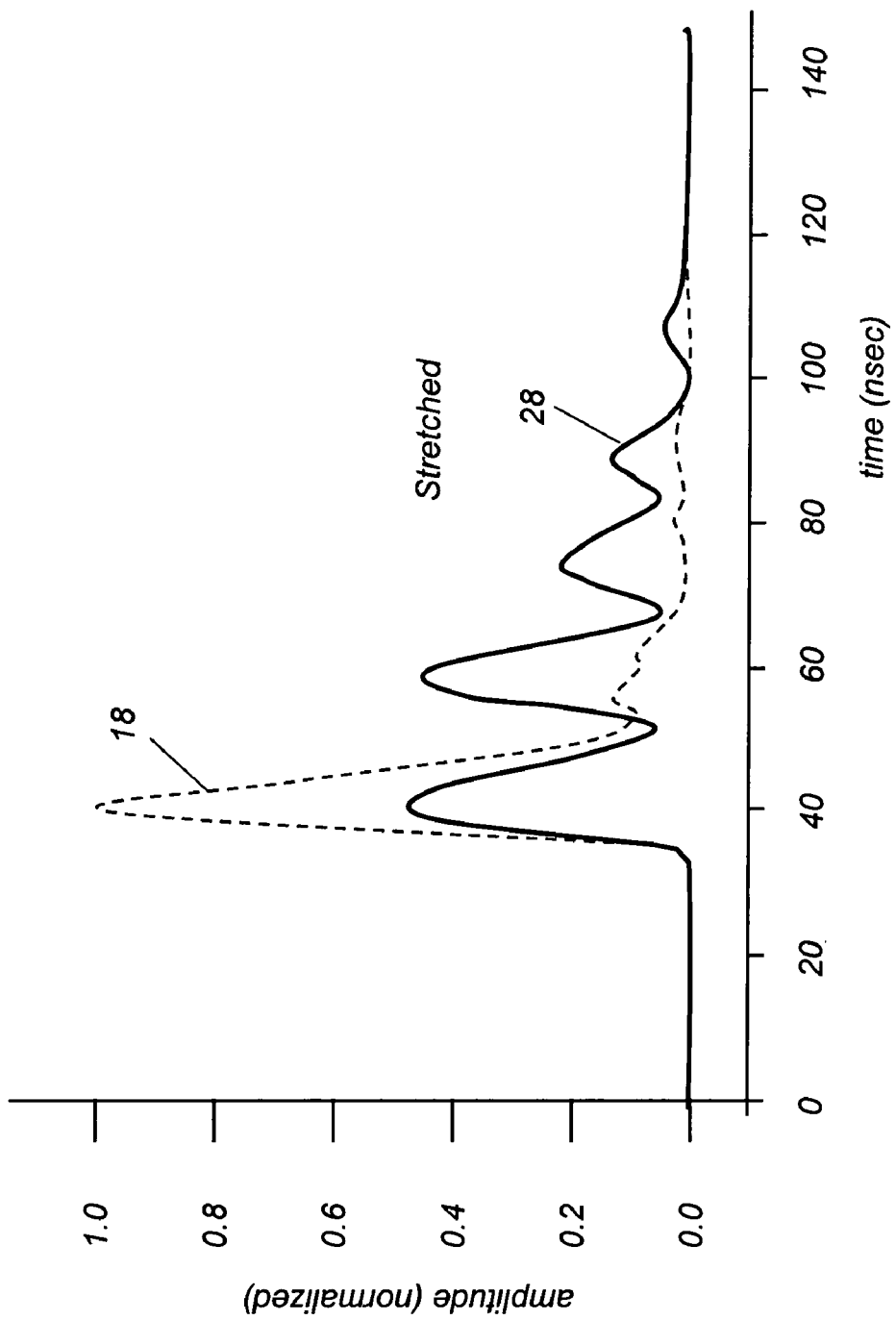
FIG. 1B is a graph showing pulse energy over time for a stretched laser pulse.
Figure 1C:
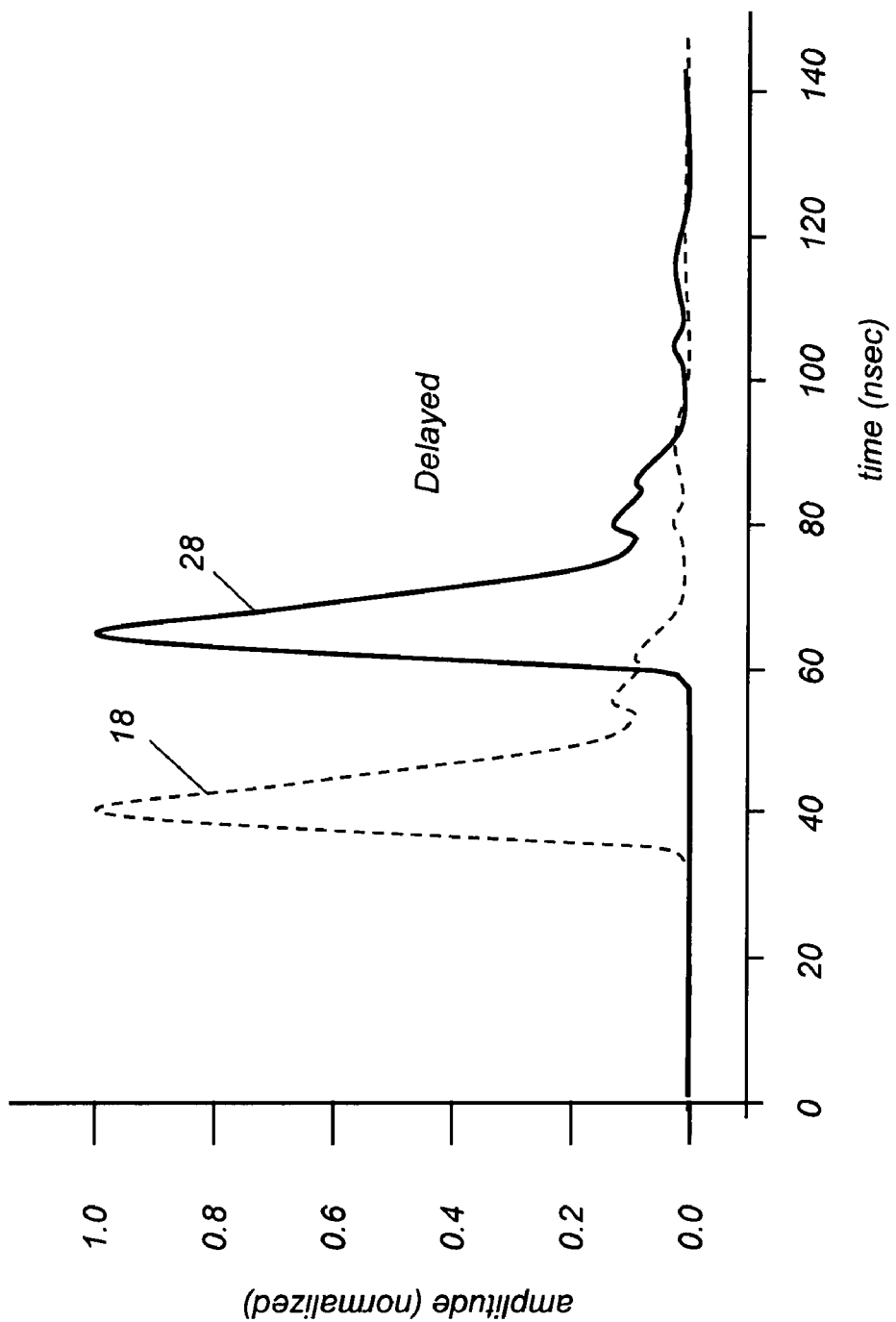
FIG. 1C is a graph showing pulse energy over time for a delayed laser pulse.
Figure 1D:
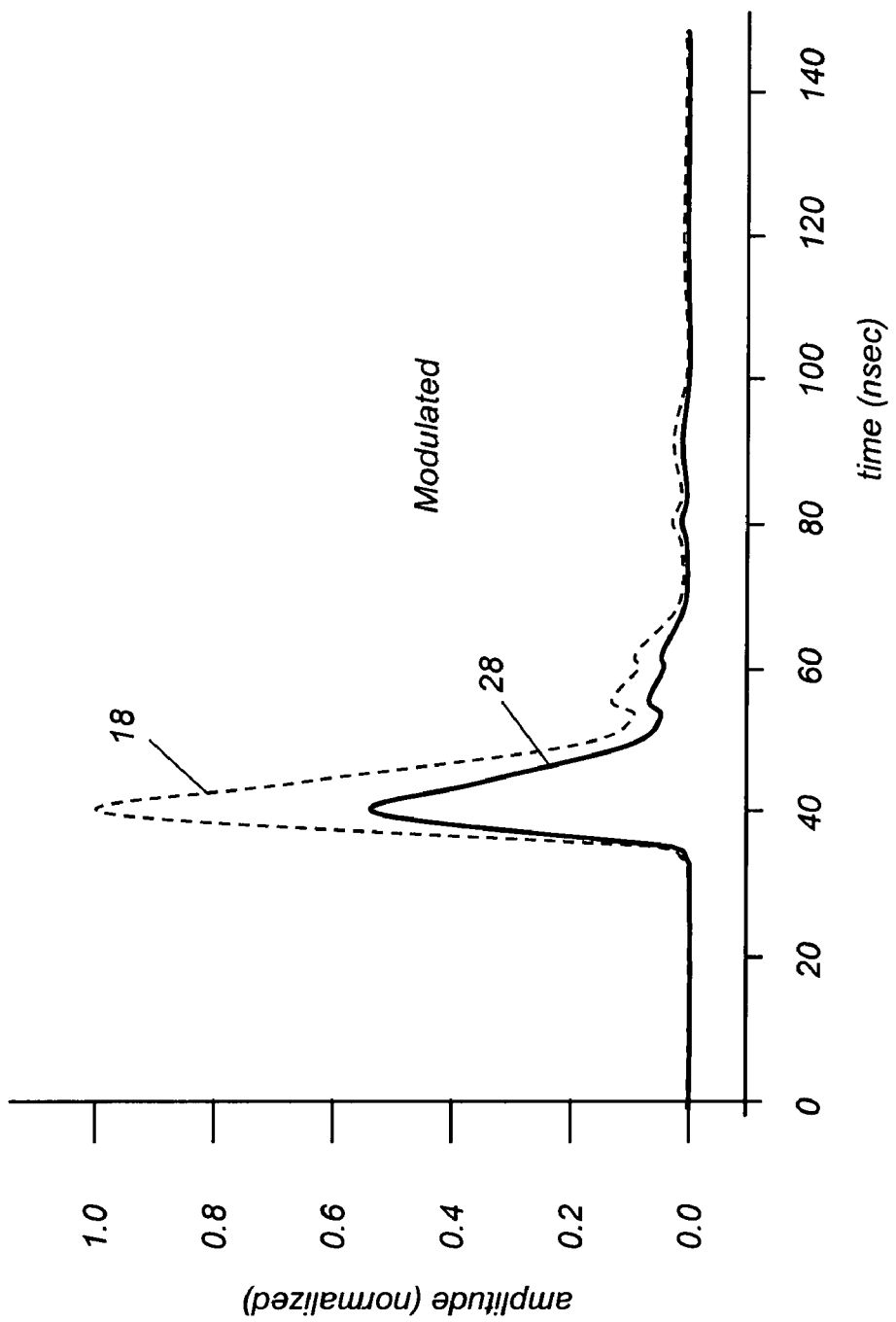
FIG. 1D is a graph showing pulse energy over time for a modulated laser pulse.

In the context of the present invention, the term "pulse conditioning" refers to the various ways in which the energy profile, or time/power distribution, of a laser pulse, or other high energy directed radiation pulse, can be modified and provide some portion or nearly all of the same energy content with a different time distribution. Thus, pulse conditioning includes pulse delay and pulse stretching, as described in the background section given earlier with reference to FIGS. 1A, 1B, 1C, and 1E, as well as modulation for attenuating at least some portion of the pulse energy, as shown for pulse 28 in FIGS. 1D and 1F.

Figure 2:
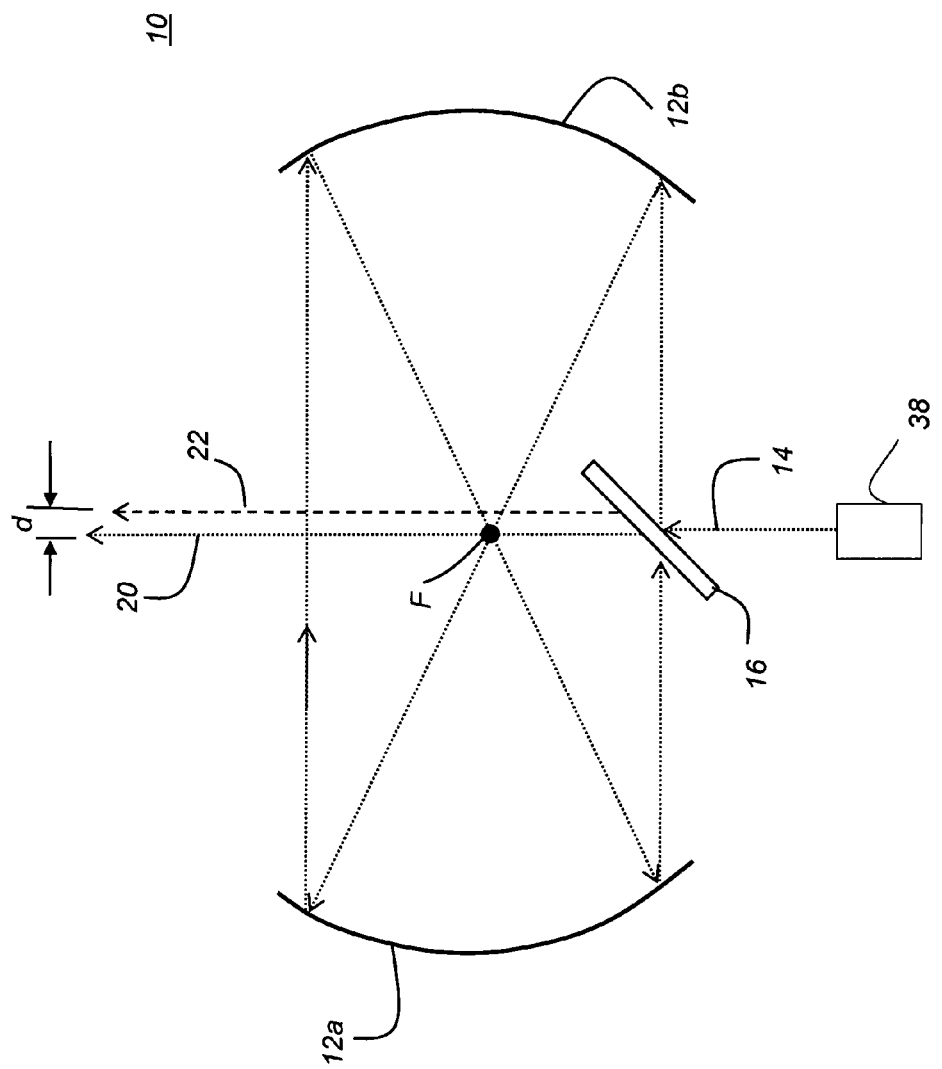
FIG. 2 is schematic diagram of an illustrative example of a pulse stretcher that shows beam broadening if two facing curved reflective surfaces are used without compensation.

The apparatus and methods of the present invention help to reduce the overall parts count for pulse stretching and pulse delaying apparatus by using one or more pairs of opposed or generally facing curved reflective surfaces. In order to perform the pulse conditioning functions needed while preserving the pulse beam shape at the same time, the curved reflective surfaces are concave, preferably parabolic, rather than spherical as with conventional beam stretching solutions. A confocal arrangement is used, so that facing mirrors share a common focus. FIG. 2 shows a basic arrangement of a conventional pulse stretcher 10 having a pair of confocal, concave curved reflective surfaces 12a and 12b with their common focus indicated at a focal point F. As is well known to those skilled in the optical arts, light that goes to parabolic curved reflective surface 12a or 12b from focus F is then collimated by the corresponding parabolic curved reflective surface 12a or 12b. In the other direction, collimated light from either surface 12a or 12b is directed through focus F.

In pulse stretcher 10, a beamsplitter is placed in the path of a laser light beam 14 from a pulsed light source 38. The beamsplitter acts as a light-redirecting element 16, redirecting a portion of beam 14 toward curved reflective surface 12b and transmitting the rest. The reflected light is then transmitted through focus F to curved reflective surface 12a, is collimated and returns to curved reflective surface 12b. The light is again directed through focus F to curved reflective surface 12a and back to light-redirecting element 16. Light incident on the surface of light-redirecting element 16 can then be further split (where light-redirecting element 16 is a beamsplitter) or reflected (where light-redirecting element 16 is a mirror or other type of reflective element) and provided as a delayed beam 22, sent along the path of an output beam 20 that is substantially in the same direction as is the first transmitted portion of the light from beam 14.

Although the configuration of pulse stretcher 10 in FIG. 2 is functional, this two-mirror arrangement has a notable drawback which has discouraged its practical application. Refractive shifting of the delayed beam, shown as beam displacement d in FIG. 2, causes some slight spatial difference between delayed beam 22 and light from beam 14 that had been initially transmitted through or past light-redirecting element 16. This is due to refraction at light-redirecting element 16. Typically light-redirecting element 16 is formed on a glass substrate or other transparent substrate, so that the redirected light that is returning from curved reflective surface 12a undergoes refraction prior to incidence on the reflective or beam-splitting surface. Beam displacement d tends to increase the beam width of the laser beam, which is not desirable for applications such as microlithography. In apparatus with more than the two reflective surfaces 12a and 12b shown in FIG. 2, alignment to compensate for and minimize or eliminate beam displacement d can be obtained by slight adjustment to the positioning of one or more mirrors. However, this type of compensatory adjustment would not be feasible with the facing, confocal reflective surface arrangement of FIG. 2.

Figure 3:
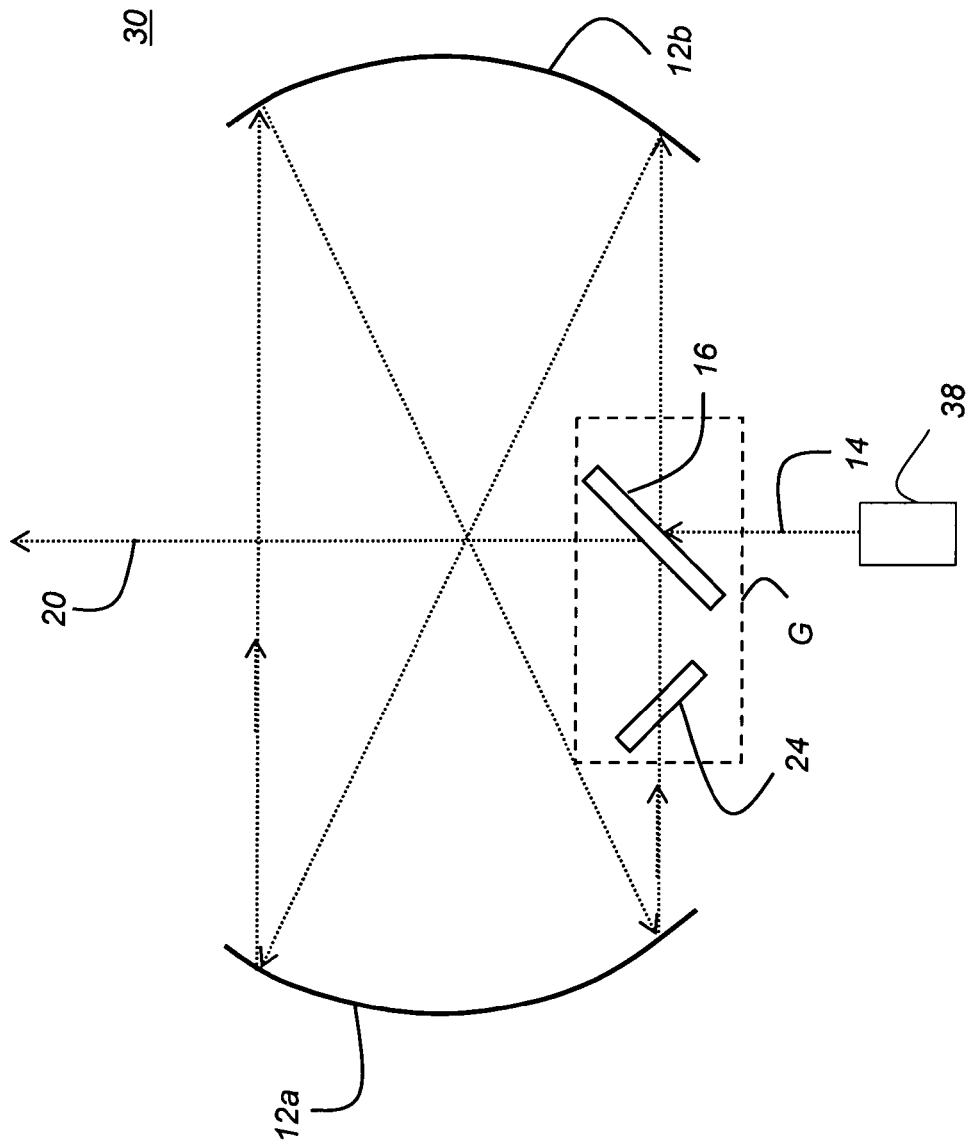
FIG. 3 is a schematic diagram that shows the use of a compensating plate in a pulse stretcher in one embodiment of the present invention.

The schematic diagram of FIG. 3 shows a two-mirror embodiment of a light pulse conditioning apparatus 30 of the present invention that corrects for the spatial displacement problem described with respect to FIG. 2. Here, a compensating element, compensating plate 24, is disposed in the path of returning light from curved reflective surface 12a. An area G is enlarged in FIG. 4 to show how compensating plate 24 refracts incoming light (from the left in FIG. 4), shifting the beam thereby, and the corresponding refraction at light-redirecting element 16. With this compensation, the delayed light that had been originally redirected from light-redirecting element 16 effectively follows the same path of corresponding light that had been transmitted through light-redirecting element 16. This shift in the optical path that is effected by the compensating element eliminates beam displacement d as was shown in FIG. 2.

Figure 1E:
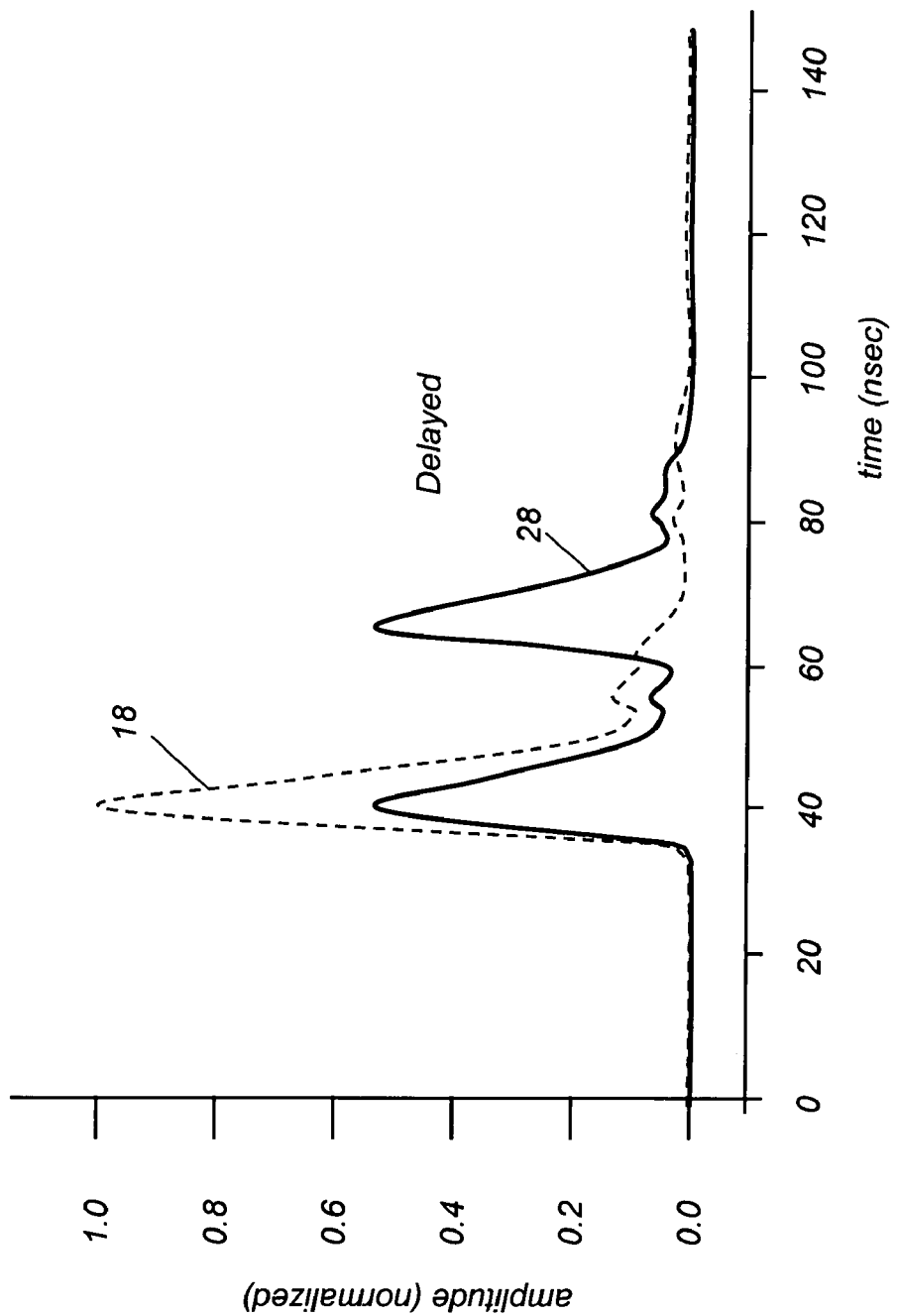
FIG. 1E is a graph showing pulse energy over time for a stretched and delayed laser pulse.
Figure 1F:
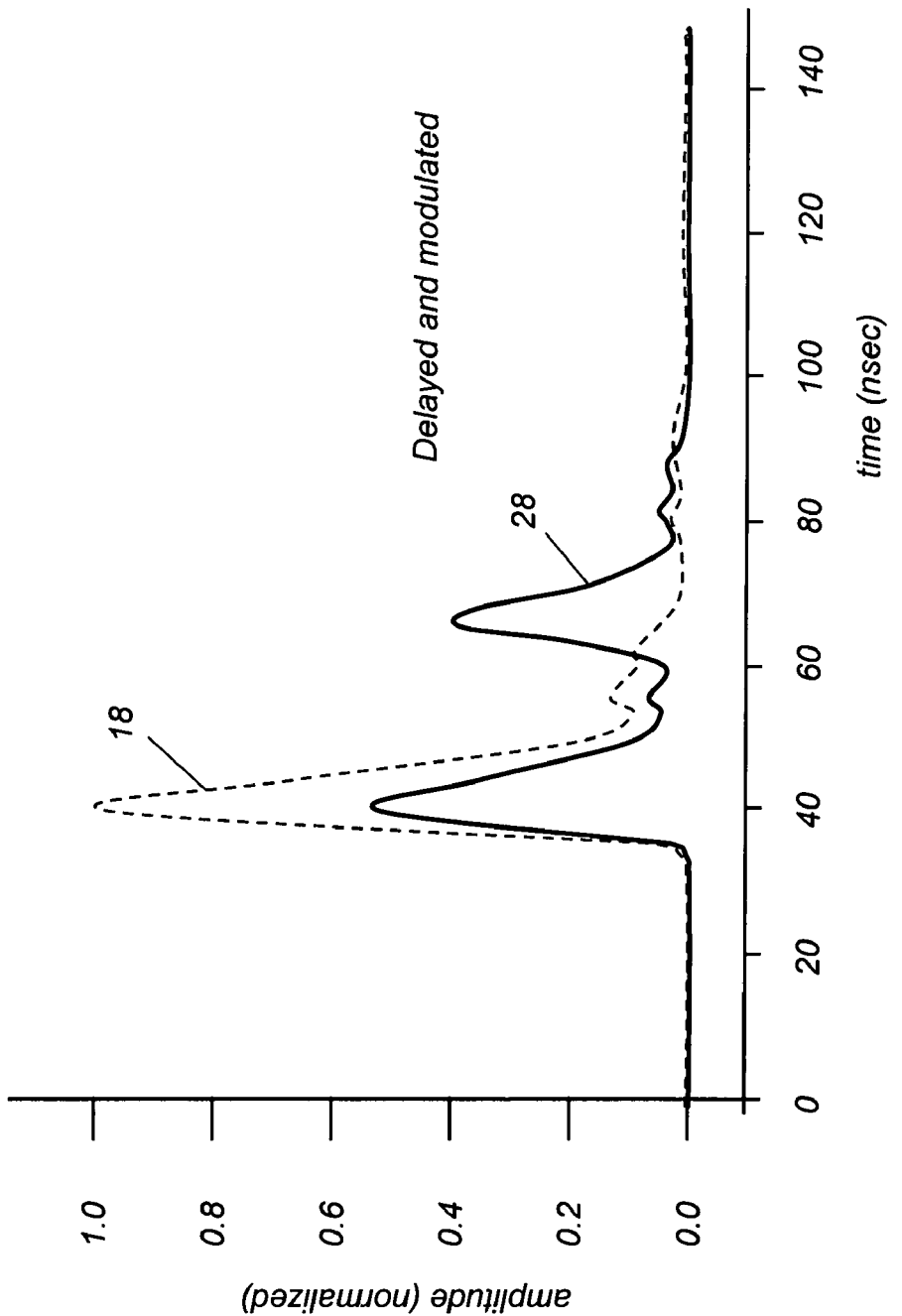
FIG. 1F is a graph showing pulse energy over time for a stretched, delayed, and modulated laser pulse.

It should be observed that light pulse conditioning apparatus 30 as shown in FIG. 3 can be either a pulse stretcher, exhibiting the pulse conditioning behavior described earlier with respect to pulse 28 in FIG. 1B, or a pulse delay apparatus, exhibiting the pulse conditioning behavior with more discrete peak portions shown in pulse 28 of in FIG. 1E. When light-redirecting element 16 is a beamsplitter, pulse stretching occurs. When light-redirecting element 16 is a mirror, prism, or other reflective surface, pulse delay occurs.

Figure 5A:
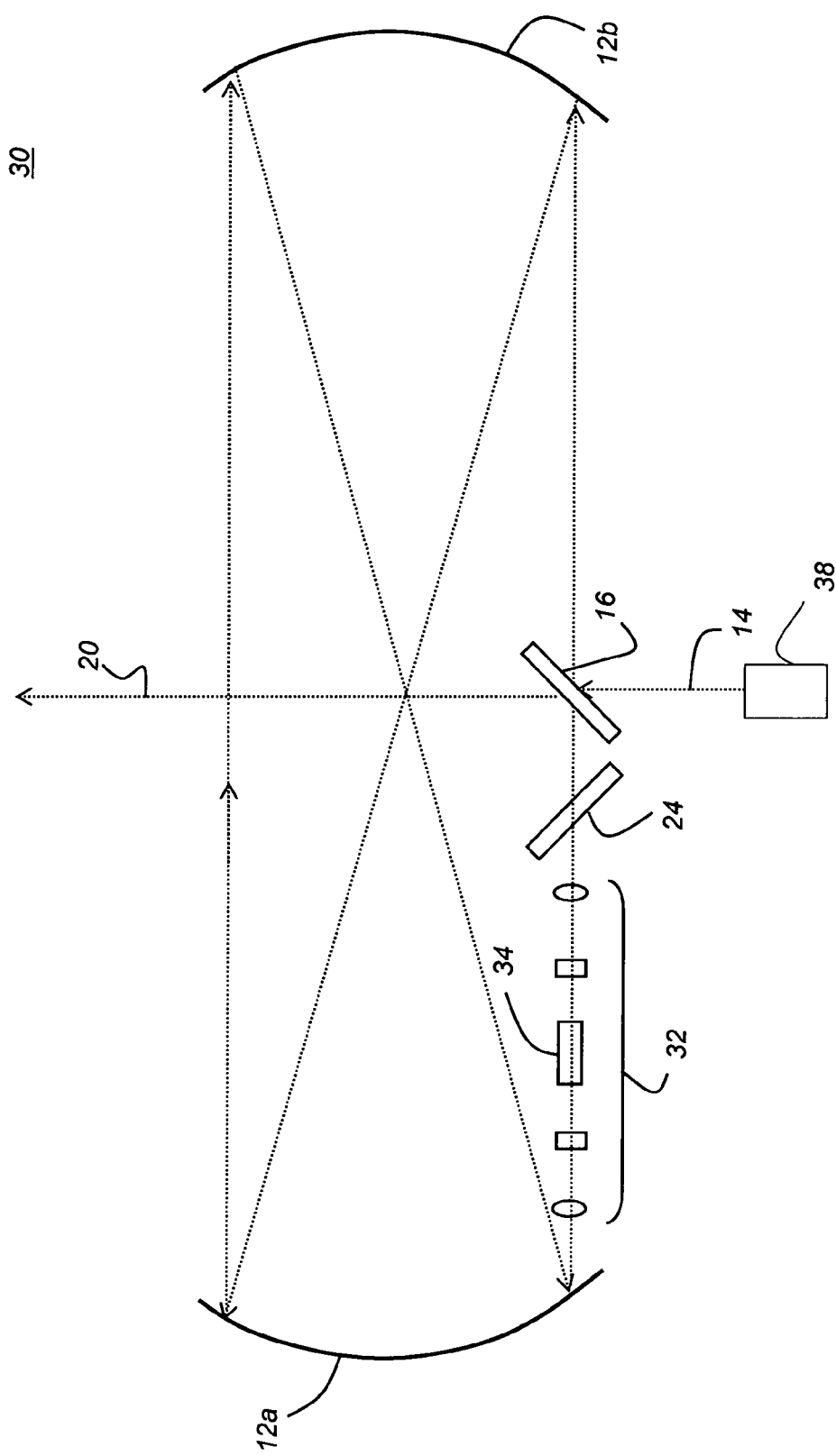
FIG. 5A is a schematic diagram showing a light pulse conditioning apparatus with an attenuator apparatus in one embodiment.
Figure 6:
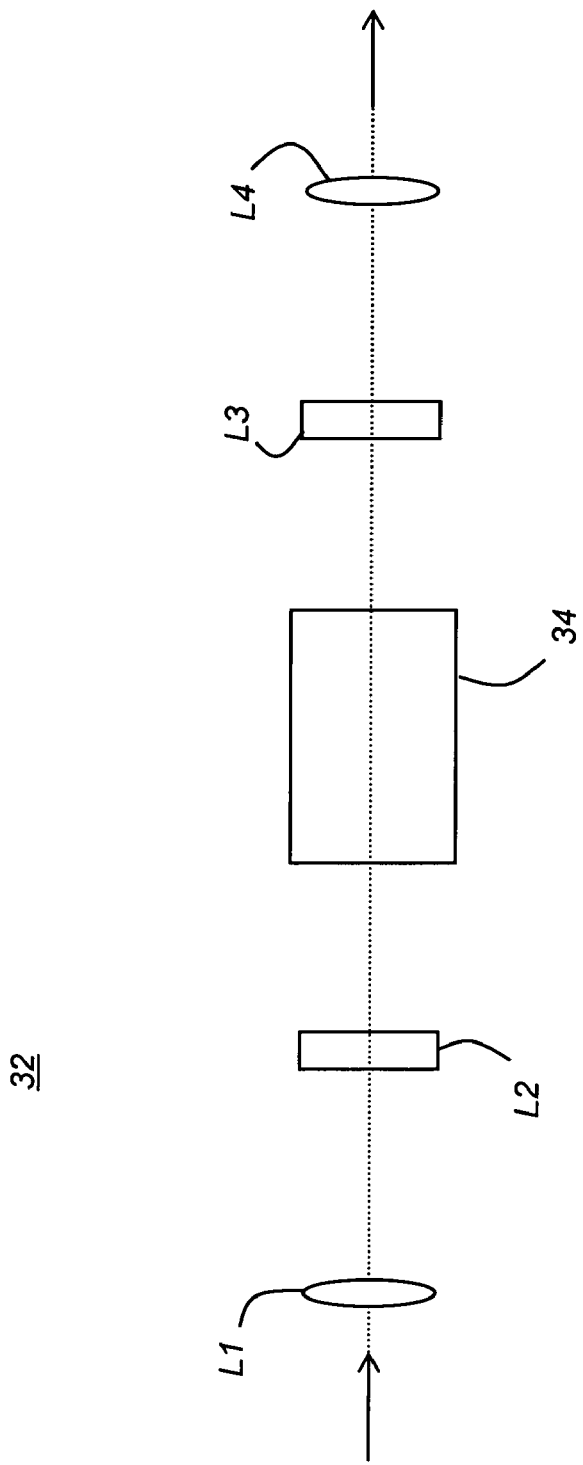
FIG. 6 is a schematic diagram of an attenuator apparatus in one embodiment.

Attenuation or other modulation of the pulse may also be necessary. Unlike conventional solutions that do not provide modulation along with pulse delay or stretching, the apparatus and methods of the present invention allow modulator components to be used as part of light pulse conditioning apparatus 30. Referring to the schematic diagram of FIG. 5A, there is shown an embodiment of light pulse conditioning apparatus 30 having a modulator assembly 32 disposed in the return path of delayed light as it approaches light-redirecting element 16. Modulator assembly 32 has some type of modulator element 34, such as a variable attenuator, supported by optical components. In the embodiment of modulator assembly 32 shown in FIG. 6, modulator element 34 is a Pockels cell attenuator. The incoming light beam, from the left in FIG. 6, is directed by a lens L1 to a cylindrical lens L2 that adapts the beam dimensions suitably for the Pockels cell device. Another cylindrical lens L3 then reshapes the light beam and provides it to a lens L4 at the output of modulator assembly 32.

Figure 5C:
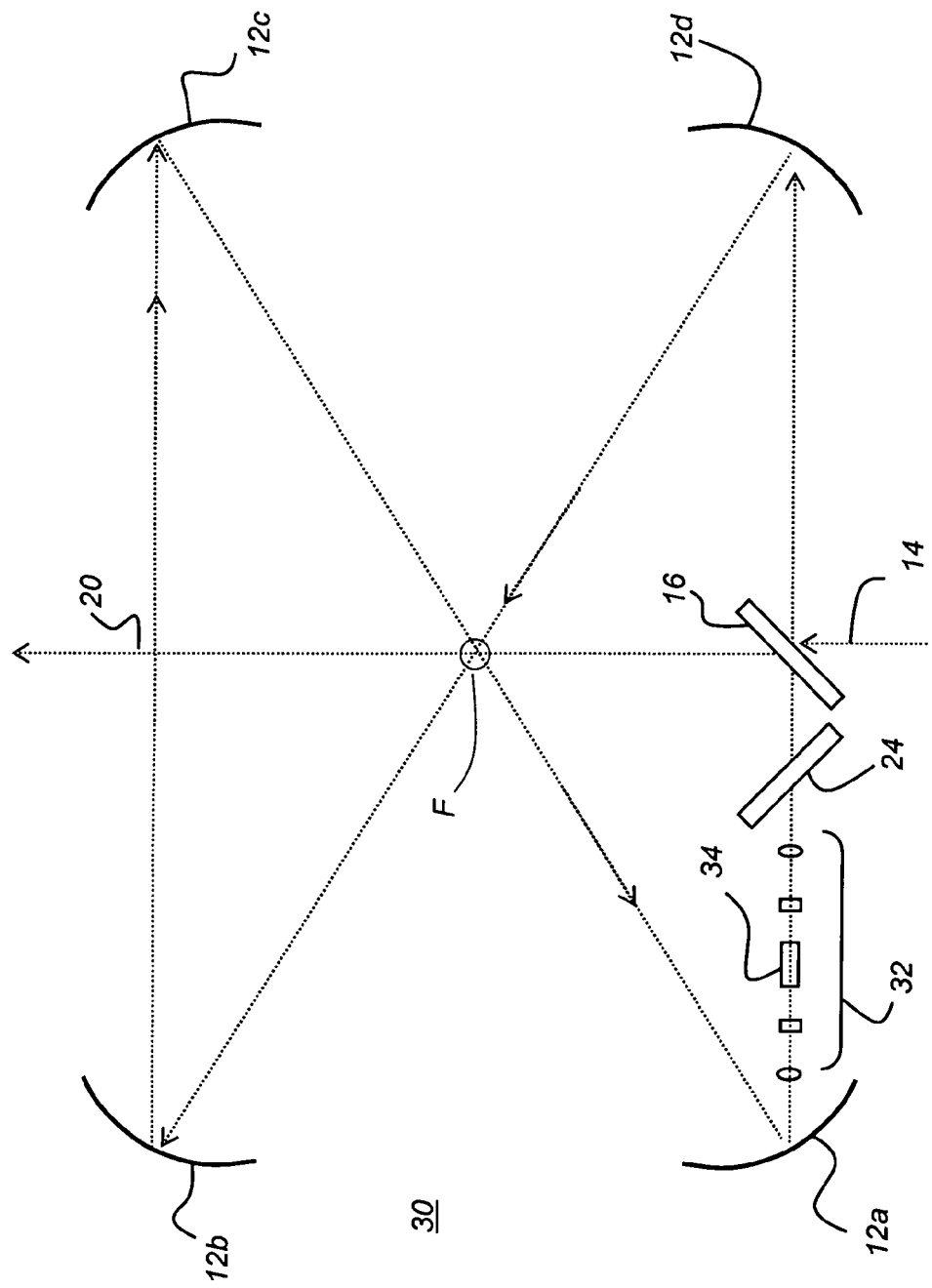
FIG. 5C is a schematic diagram showing a light pulse conditioning apparatus with an attenuator apparatus in an embodiment using more than two confocal mirrors.

FIGS. 5B and 5C show alternate embodiments that fit modulator assembly 32 within light pulse conditioning apparatus 30, between first and second curved reflective surfaces. In these embodiments, the opposed curved reflective surfaces 12a, 12b, 12c, and 12d substantially share a common focus, again shown at F. Light-redirecting element 16 can be fully reflective, working with an optional reflective light-redirecting element 36 and providing the pulse delay system of FIG. 5B. Alternately, light-redirecting element 16 can be partially reflective, providing the pulse stretching system of FIG. 5C. A compensating element such as compensating plate 24 is optional for the delay embodiment of FIG. 5C. (The use of four reflective surfaces 12a-12d allows some minor adjustment of surface position and orientation for optical compensation, making compensating plate 24 less necessary.)

Modulator Types

There are a number of types of devices that can be used as modulator element 34 for pulsed laser modulation. These include, for example, devices that deflect a portion of the laser light or cause diffraction, such as various types of acousto-optical modulators (AOM) and electro-optical modulators (EOM). Other types of modulators operate using light polarization state, such as a liquid crystal (LC) modulator. Still other types of pulsed light modulators operate by mechanical action, obstructing some variable portion of the laser beam, actuated by devices such as voice coils, piezoelectric actuators, motors, and servo devices, for example. Mechanical modulators can be galvanometer-driven.

Each type of modulator that is conventionally used for pulsed laser modulation has some limitations. For example, mechanical devices operate only within a range of speeds. Some types of devices, such as acousto-optical modulators, are effective only over a range of wavelengths. A number of types of devices are limited in the amount of pulsed energy that they are able to withstand. Pockels cell modulators are advantaged for speed, but can be damaged if exposed to full power laser pulses.

Figure 7:
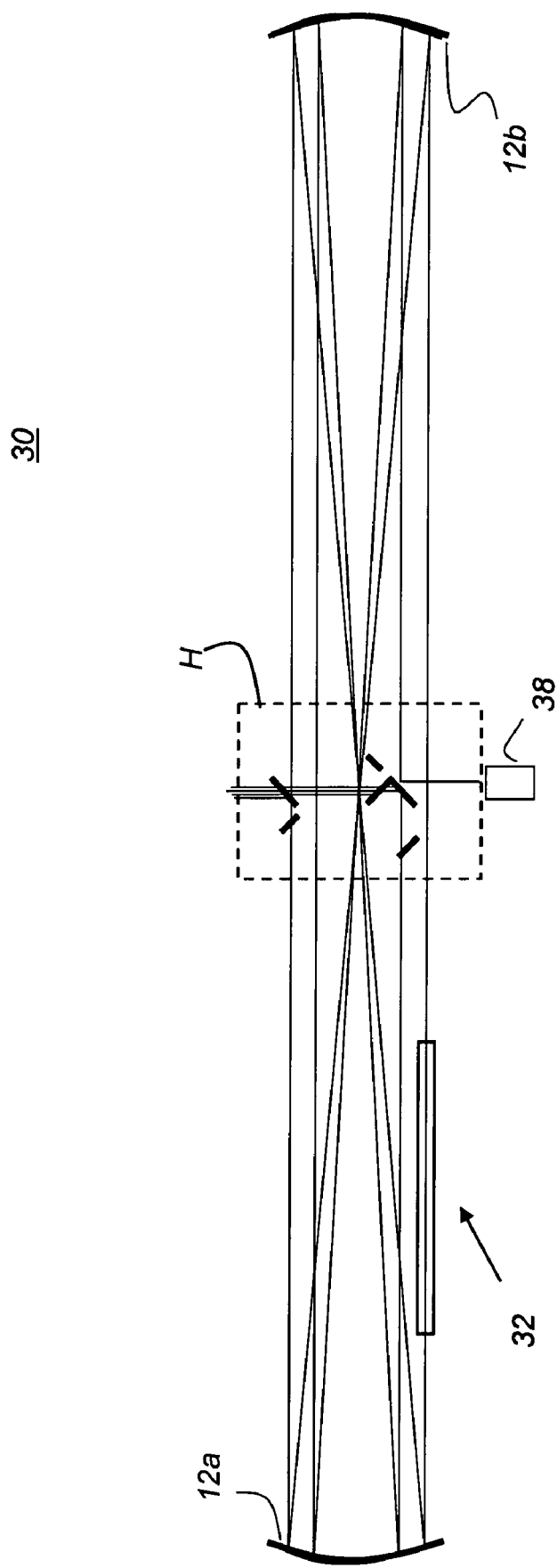
FIG. 7 is a schematic diagram showing a light pulse conditioning apparatus of an embodiment that provides multiple delay pulses and attenuation.

Embodiments of FIGS. 5A, 5B, and 5C allow a combination of delay, stretching, and modulation for conditioning each pulsed laser beam. There can be additional advantages to apparatus and methods that provide multiple delay paths and are capable of allowing more time for modulation response and reduced power through the modulation device. FIG. 7 shows an embodiment of light pulse conditioning apparatus 30 that provides multiple delay paths for this purpose. Area H contains a plurality of pulse delay assemblies that provide the delay paths. The sequence of FIGS. 8A through 8D traces each delay path, labeled A, B, C, and D, for the pulse conditioning apparatus of the embodiment shown in FIG. 7. As can be seen, scaling has been adjusted in order to make the sequence of FIGS. 8A-8D more easily understood.

Figure 8A:
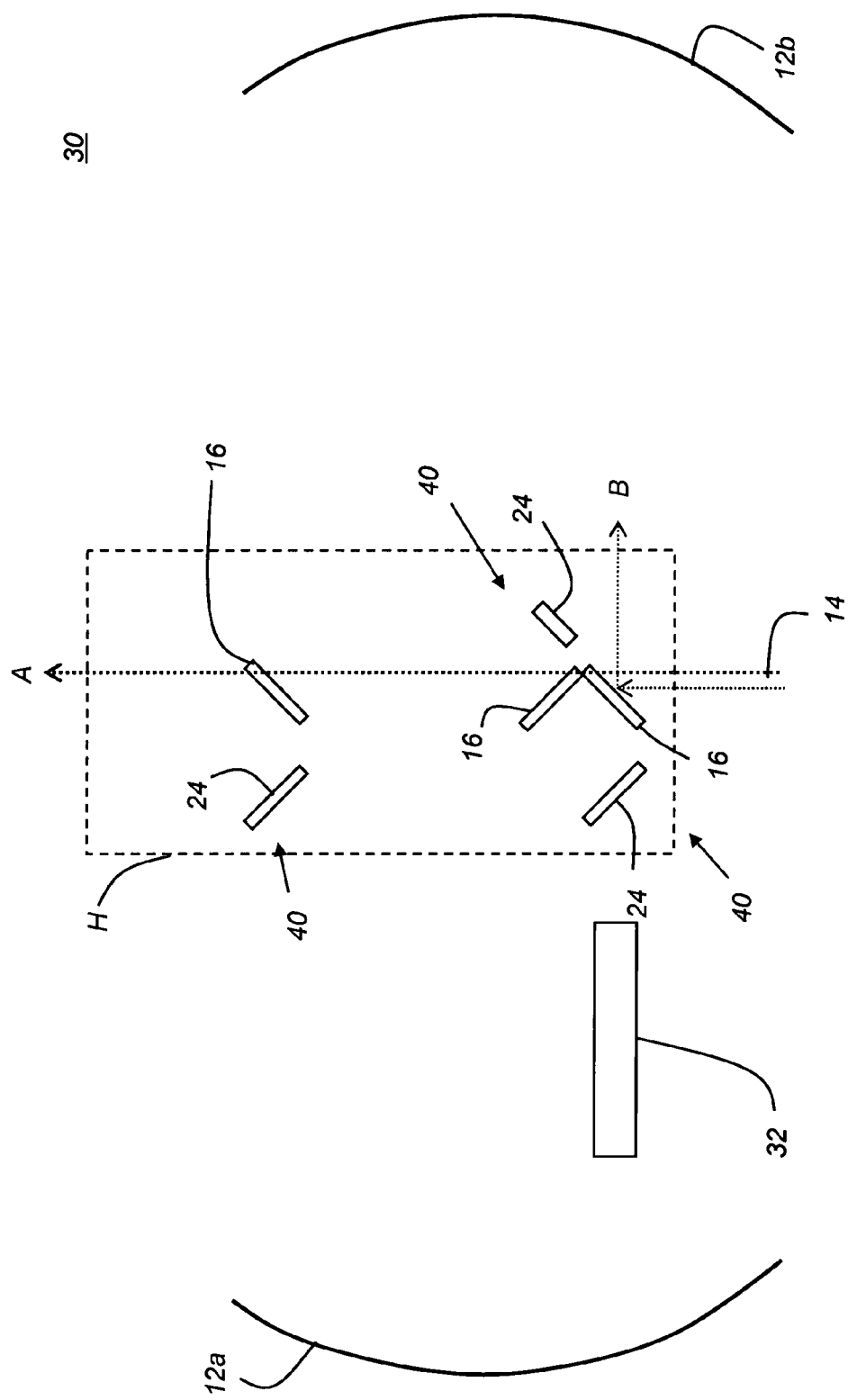
Figure 8C:
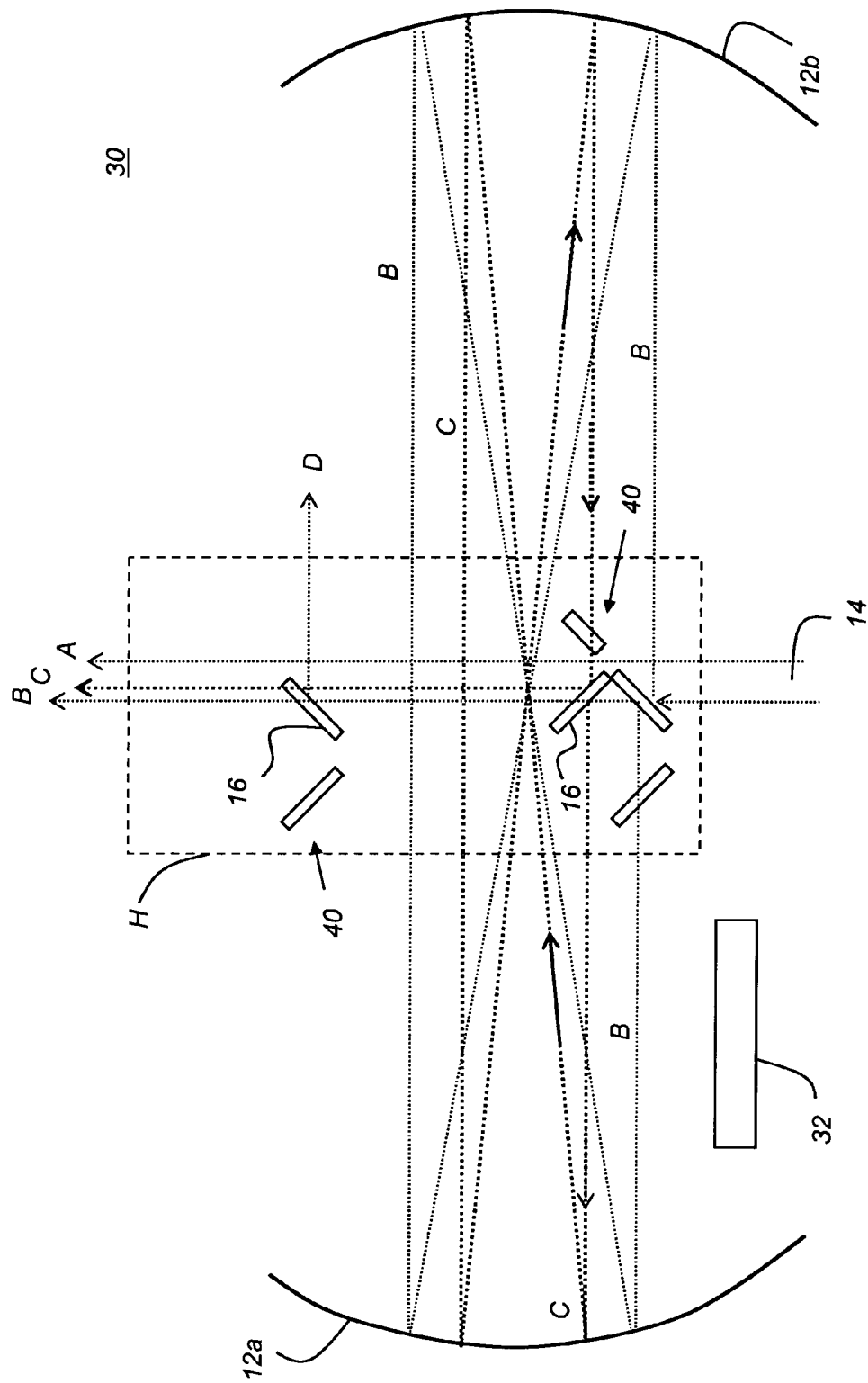
Figure 8D:
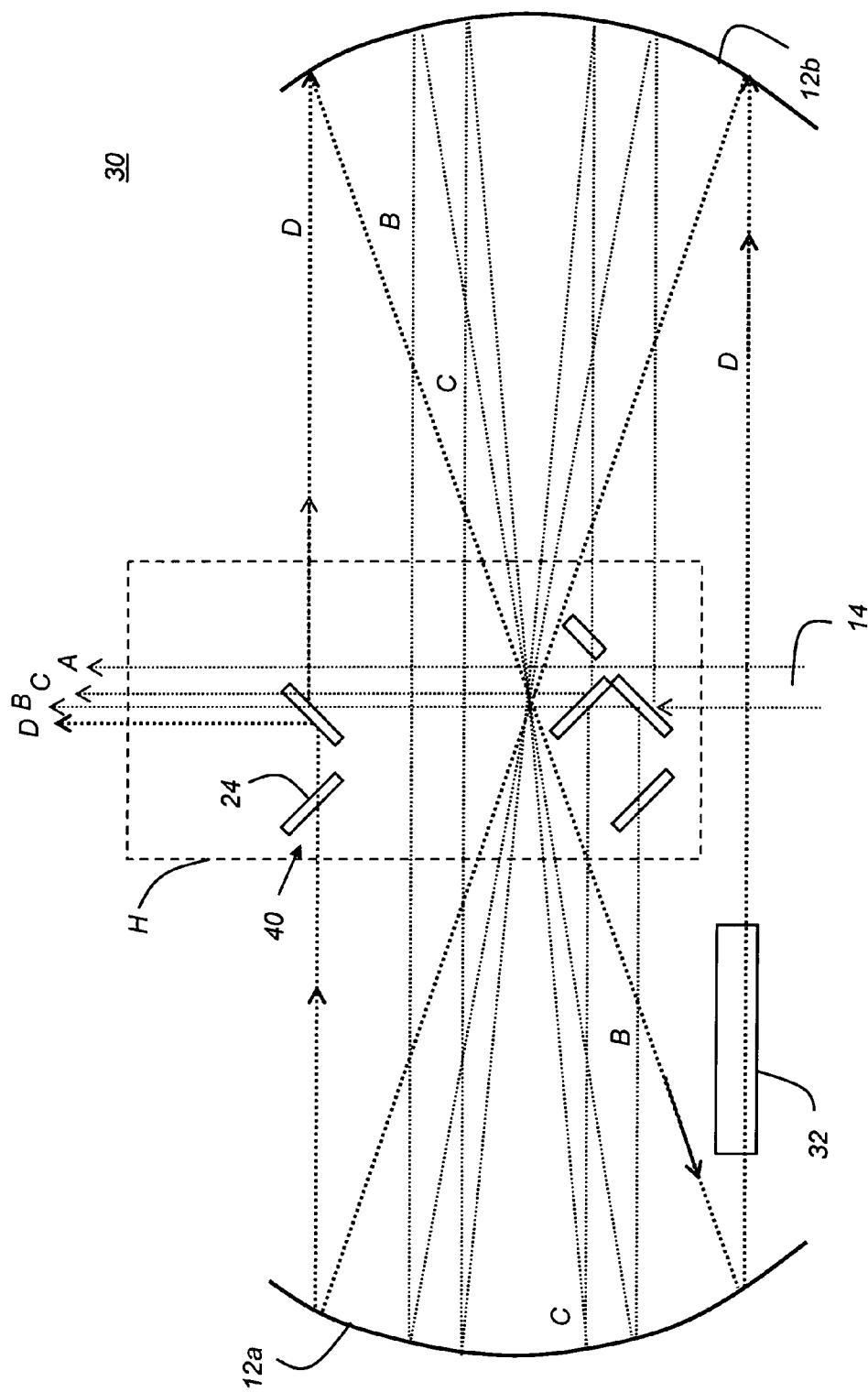
Figure 10:
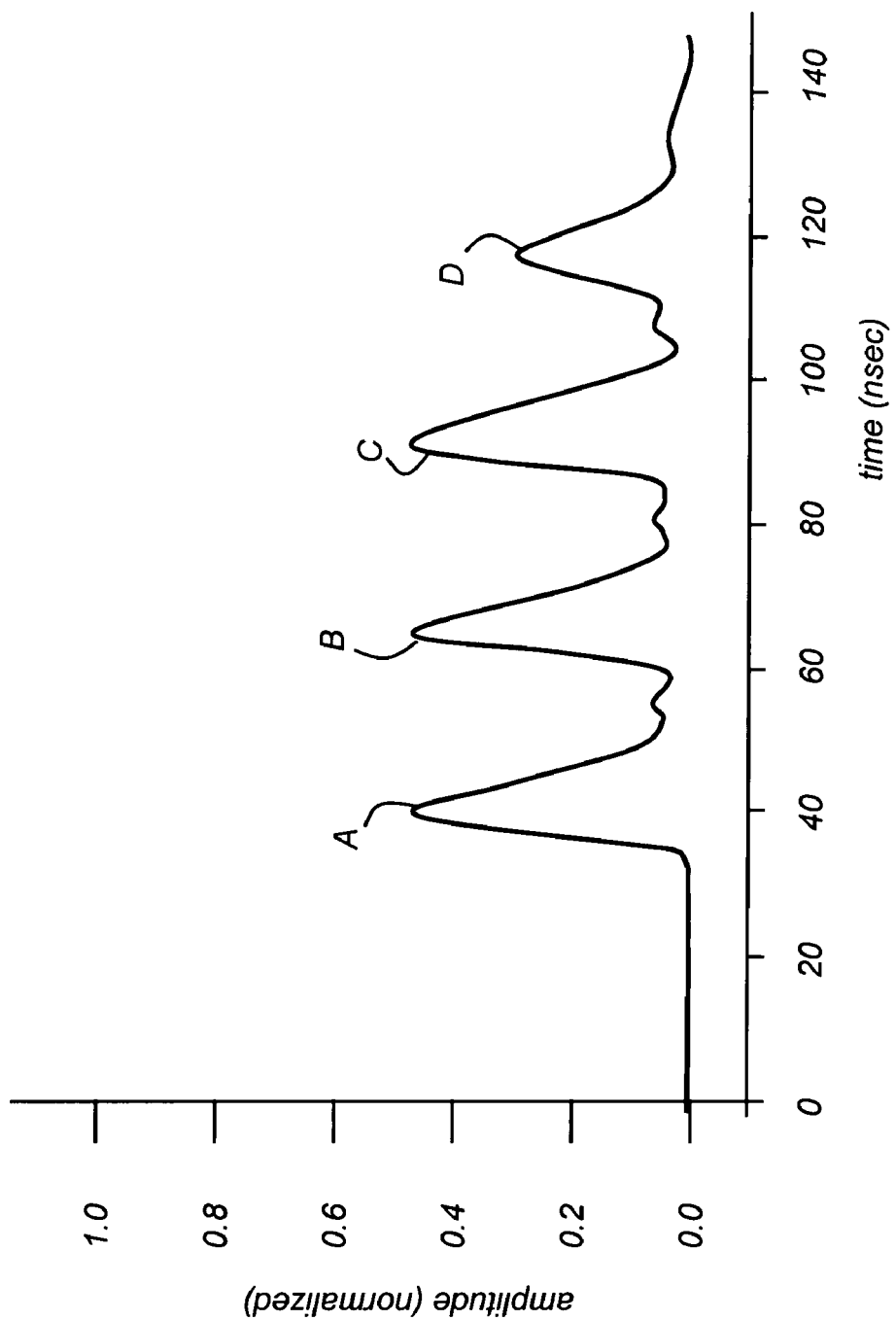
FIG. 10 is a graph showing delayed light pulses through each delay path for the pulse conditioning apparatus of the embodiment shown in FIG. 7, with attenuation in the longest delay path.

FIG. 9 is a perspective view showing reflective, transmissive, and compensating plate elements that are in each delay path A, B, C, and D for the pulse conditioning apparatus of the embodiments shown in FIGS. 7-8D. FIG. 10 is a graph showing delayed light pulses through each delay path A, B, C, and D for the pulse conditioning apparatus of the embodiment shown in FIGS. 7-8D, with attenuation in the longest delay path D.

As shown in FIG. 8A, area H has three pulse delay routers 40. These are shown in perspective view in FIG. 9. Each pulse delay router 40 has a light-redirecting element 16 and a compensating element such as compensating plate 24. A portion of input beam 14 from a laser or other pulsed radiation source is redirected at a first light-redirecting element 16. As shown more clearly in FIG. 9, first light-redirecting element 16 for input beam A has a transmissive portion 42 and a reflective portion 44. With this arrangement, each reflective portion 44 intercepts a portion of its incident beam for redirection; the rest of the beam is directed through transmissive portion 42. In the embodiment shown, three-fourths of incident beam 14 is redirected from the first light-redirecting element 16; half of the incident light from the second light-redirecting element 16; one-fourth from the third light-redirecting element 16. It should be noted that these proportions for beam redirection are exemplary and can be adjusted for different applications, with successive delay routers 40 configured differently, having different spatial arrangements and ratios of transmissive portion 42 to reflective portion 44.

Returning to FIG. 8A, it can be seen that a portion of incident beam 14 is transmitted straight through pulse conditioning apparatus 30, without any delay or modulation. This is represented as portion A in the graph of FIG. 10. The rest of the light from incident beam 14 is directed toward curved reflective surface 12b. FIG. 8B shows the routing of this light (labeled B) within pulse conditioning apparatus 30. Collimated with respect to reflective surface 12b, this light is directed through the focus and to curved reflective surface 12a. Curved reflective surface 12a collimates this light and curved reflective surface 12b directs it back through focus to curved reflective surface 12a. This returning light is beam-shifted through compensating plate 24 and reflected from the same light-redirecting element 16 from which it was initially redirected. A portion of this light is then transmitted outward from pulse conditioning apparatus 30, forming component B of the pulsed output, as labeled in FIGS. 8B and 10. FIG. 9 shows the reflective portion 44 that serves to redirect this light in both its outward and return paths.

Similarly, FIG. 8C shows how pulse component C is formed. Redirected light (labeled C) from the second light-redirecting element 16 is directed back and forth between curved reflective surfaces 12a and 12b and directed back to the same light-redirecting element 16 through its corresponding compensating plate 24. A portion of this light is further redirected for forming component D, using the additional routing sequence shown in FIG. 8D.

As is shown in FIG. 8D, modulator assembly 32 lies in the delay path for pulsed light component D. This arrangement allows power modulation of that portion of the delayed output, as is shown in the graph of FIG. 10.

In each case for pulse components B, C, and D, the same light-redirecting element 16 first redirects the input light to the delay sequence, that is, to reflection between curved reflective surfaces 12a and 12b, and then redirects the delayed light to the output. With this configuration, since the same device provides redirection for both incoming and outgoing light and is imaged to itself by curved reflective surfaces 12a and 12b, alignment is greatly simplified over conventional solutions in which input and output light-redirecting functions are performed by different devices.

Compensating plate 24 is generally formed from the same transparent material that is used as the substrate for light-redirecting element 16. Compensating plate 24 could be glass, fused silica, calcium fluoride or other UV-transmissive fluoride crystal, for example. The use of compensating plate 24 is particularly beneficial for improving light alignment in configurations in which the same device redirects light to and from the delay path.

Light-redirecting element 16 as shown in FIG. 9 has both reflective portion 44 and transmissive portion 42, as described earlier. It can be observed that transmissive portion 42 could be air rather than a transmissive substrate.

Figure 11:
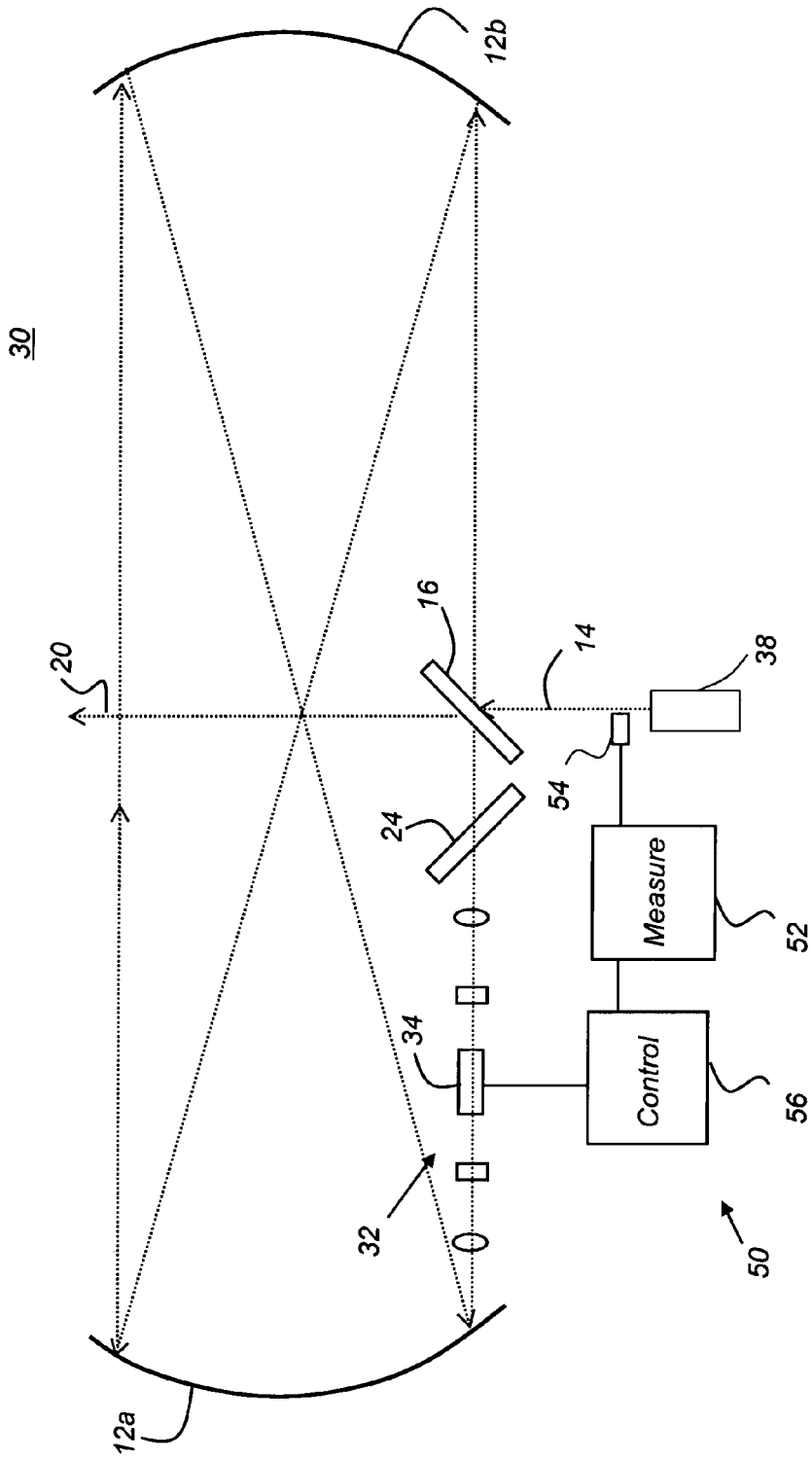
FIG. 11 is a schematic diagram of a light pulse conditioning apparatus with a control loop for monitoring and adjusting pulse power.

The arrangement of FIGS. 7 and 8A-8D has advantages where it is useful to control the overall energy level of each successive pulse. Modulation of that portion of the pulsed radiation beam that has the longest delay, as provided by this arrangement, allows time for response to changes in detected pulse energy. Referring to FIG. 11, there is shown a schematic diagram of light pulse conditioning apparatus 30 with a control loop 50 for monitoring and adjusting pulse power. A measurement device 52 uses a sensor 54 to detect the relative energy level of input beam 14 from the laser or other pulsed radiation source. Measurement device 52 provides a signal to a controller 56 for modulator element 34. Using this type of arrangement, where pulse power exceeds a target value, control loop 50 energizes modulator element 34 to provide some level of attenuation. The delay that is provided by one or more pulse delay routers 40, as was described earlier with reference to FIGS. 8A-8D, allows some amount of response time for control loop 50, enabling modulation of one or more delayed components of the output pulse. Pockels cell modulators can be particularly useful with embodiments such as those of FIGS. 7 and 8A-8D that reduce laser power using one or more delay paths. It can be observed that there are some constraints on the length of the control loop 50 circuit traces because the electrical signal travels more slowly than light. The distance between sensor 54 and modulator element 34 must be less than the delay path length that begins when the delayed portion of the pulsed light is first sensed and ends when the same delayed portion reaches modulator element 34 before it is deflected toward the output of light pulse conditioning apparatus 30.

Figure 12:
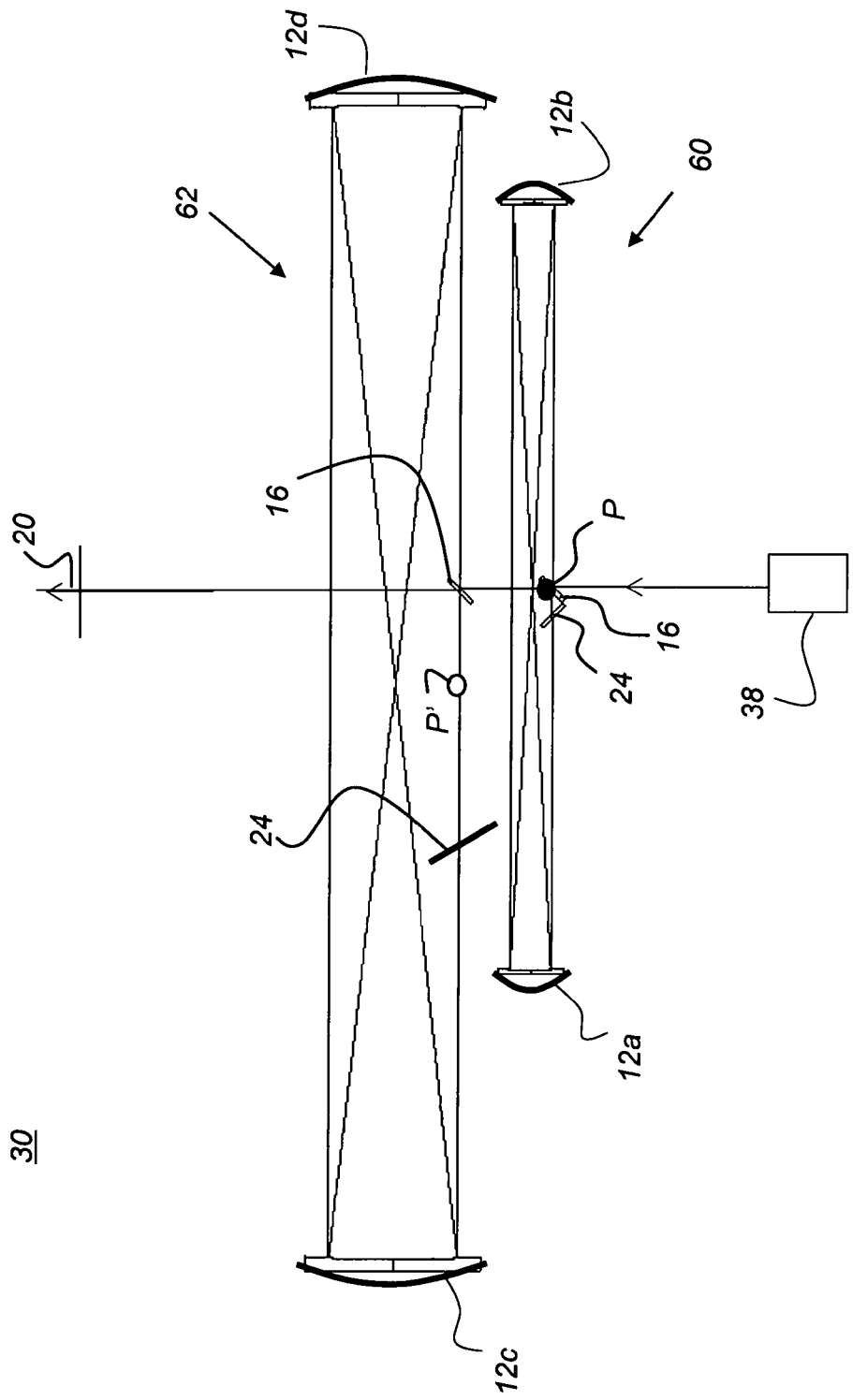
FIG. 12 is a schematic diagram of a light pulse conditioning apparatus having both a pulse stretcher and a pulse delay apparatus.

Pulse stretching and pulse delay apparatus can be readily combined using the opposed-mirrors configurations of embodiments of the present invention. Referring next to FIG. 12, there is shown an embodiment of light pulse conditioning apparatus 30 that has a pulse stretcher 60 followed by a pulse delay apparatus 62. In pulse stretcher 60, light-redirecting element 16 is a beamsplitter. In pulse delay apparatus 62, light-redirecting element 16 is a reflective element. Both pulse stretcher 60 and pulse delay apparatus 62 use compensating plates 24. A pupil P of pulse stretcher 60 is optically identical to corresponding pupil P' of pulse delay apparatus 62. With such an arrangement, no lenses or other light conditioning optics are needed in order to direct light output from pulse stretcher 60 to pulse delay apparatus 62 and relay the pupil P of pulse stretcher 60 to the pupil P' of pulse delay apparatus 62.

The apparatus and methods of the present invention provide light pulse condition that can be used with a number of laser types, including excimer lasers, as well as with pulsed radiation sources in general. Using parabolic or substantially parabolic facing mirrors or similar surfaces, embodiments of the present invention provide adaptable light pulse conditioning with reduced parts count and complexity. By using compensating plate 24 as a compensating element in each delay path, these embodiments help to minimize displacement of the outgoing beam, simplifying the optics needed to direct the conditioned output beam onto a workpiece or surface for microlithography and other precision applications. Embodiments of the present invention add the capability to modulate some or all of the delayed pulsed energy beam, thus providing not only the capability for stretching and delaying one or more portions of pulsed energy as shown in the graphs of FIGS. 1B, 1C, and 1E, but also the additional control for conditioning light pulses shown in the graphs of FIGS. 1D and 1F. Further, because it can help to reduce beam coherence, the delay path provided in both beam stretching and delay embodiments of the present invention additionally provides the benefit of reduced speckle.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. As noted earlier, the source of incident radiant energy could be an excimer laser or some other type of high frequency source of electromagnetic radiation. Modulator assembly 32, where used, could be provided for modulation of light in one or more delay paths. More than one modulator assembly 32 or modulator element 34 could be used.

Thus, what is provided is a method and apparatus for conditioning pulsed light energy output.

The invention claimed is:

1. A light pulse conditioning apparatus comprising:
   a) at least first and second curved reflective surfaces that share a common focus;
   b) a light-redirecting element disposed between the at least first and second curved reflective surfaces to redirect at least a portion of an incident light beam toward the second curved reflective surface as a delayed beam portion;
   and
   c) a light modulator disposed between the first curved reflective surface and the light-redirecting element and in the path of the delayed beam portion for modulating the delayed beam portion as it returns toward the light-redirecting element.

2. The light pulse conditioning apparatus of claim 1 further comprising a beam-shifting compensating element disposed between the light modulator and the light-redirecting element and in the path of the modulated delayed beam portion, for shifting the optical path of the modulated delayed beam portion as it returns toward the light-redirecting element.

3. The light pulse conditioning apparatus of claim 1 further comprising a sensor for sensing the power of the incident light beam.

4. The light pulse conditioning apparatus of claim 1 wherein the light-redirecting element is taken from the group consisting of a beamsplitter, a prism, and a mirror.

5. The light pulse conditioning apparatus of claim 1 wherein the light modulator comprises a Pockels cell.

6. A light pulse conditioning apparatus comprising:
 a) first and second curved reflective surfaces that share a common focus; and
 b) a plurality of pulse delay routers disposed between the first and second curved reflective surfaces, each pulse delay router comprising:
  (i) a light-redirecting element disposed to redirect a portion of an incident light beam toward one of the curved reflective surfaces as a delayed beam portion; and
  (ii) a beam-shifting compensating element disposed in the return path of the corresponding delayed beam portion, for shifting the optical path of the delayed beam portion as it returns toward the light-redirecting element, wherein the light-redirecting element is disposed to further redirect the corresponding beam-shifted delayed beam portion in the direction of the incident light beam.

7. The light pulse conditioning apparatus of claim 6 further comprising a pulse power modulator disposed between the first and second curved reflective surfaces and in the light path of at least one of the pulse delay routers.

8. A light pulse energy delivery apparatus comprising
 a) a pulsed light source;
 b) a sensor for providing an output signal indicative of the power of the pulsed light source;
 c) first and second curved reflective surfaces that share a common focus;
 d) one or more pulse delay routers disposed between the first and second curved reflective surfaces, each pulse delay router comprising:
  (i) a light-redirecting element disposed to redirect at least a portion of an incident light beam toward one of the curved reflective surfaces as a delayed beam portion; and
  (ii) a beam-shifting compensating plate disposed in the return path of the corresponding delayed beam portion, for shifting the optical path of the delayed beam portion as it returns toward the light-redirecting element, wherein the light-redirecting element is disposed to further redirect the corresponding delayed beam portion in the direction of the incident light beam;
 and
 e) a control circuit for controlling a modulator, wherein the modulator is disposed between the first and second curved reflective surfaces and in the light path of at least one of the pulse delay routers.

9. The light pulse energy delivery system of claim 8 wherein the measured distance between the sensor and the modulator is less than the distance traveled by redirected light in a light path that extends between the sensor and the modulator.

10. A light pulse energy delivering apparatus comprising:
 a) a pulsed light source;
 b) a pulse stretcher comprising:
  (i) first and second curved reflective surfaces that share a first common focus;
  (ii) a first light-redirecting element disposed between the first and second curved reflective surfaces to redirect at least a portion of an incident light beam toward the second curved reflective surface as a first delayed beam portion;
  (iii) a first beam-shifting compensating element disposed between the first curved reflective surface and the first light-redirecting element and in the path of the first delayed beam portion, for shifting the optical path of the first delayed beam portion as it returns toward the first light-redirecting element;
 and
 c) a pulse delay apparatus comprising:
  (i) third and fourth curved reflective surfaces that share a second common focus and have a pupil;
  (ii) a second light-redirecting element disposed between the third and fourth curved reflective surfaces to redirect at least a portion of an incident light beam from the pulse stretcher toward the fourth curved reflective surface as a second delayed beam portion;
  (iii) a second beam-shifting compensating element disposed between the third curved reflective surface and the second light-redirecting element and in the path of the second delayed beam portion, for shifting the optical path of the second delayed beam portion as it returns toward the second light-redirecting element;
  wherein the first light-redirecting element is optically conjugate to the pupil formed by the third and fourth curved reflective surfaces.

11. The light pulse conditioning apparatus of claim 6 wherein the light-redirecting element for at least one of the plurality of pulse delay modulators comprises a reflective portion and a transmissive portion.

* * * * *